United States Patent
Au et al.

(10) Patent No.: US 9,595,924 B2
(45) Date of Patent: Mar. 14, 2017

(54) CALIBRATION FOR POWER AMPLIFIER PREDISTORTION

(75) Inventors: Stephen Au, San Diego, CA (US);
Vikram Magoon, San Diego, CA (US);
Long Bu, San Diego, CA (US);
Dandan Li, San Diego, CA (US);
Weifeng Feng, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 867 days.

(21) Appl. No.: 13/566,034

(22) Filed: Aug. 3, 2012

(65) Prior Publication Data

US 2014/0036973 A1    Feb. 6, 2014

(51) Int. Cl.

| | |
|---|---|
| H04B 1/38 | (2015.01) |
| H03F 1/32 | (2006.01) |
| H03F 3/24 | (2006.01) |
| H04L 27/36 | (2006.01) |
| H04B 1/04 | (2006.01) |
| H04B 1/525 | (2015.01) |

(52) U.S. Cl.
CPC ......... *H03F 1/3247* (2013.01); *H03F 1/3294* (2013.01); *H03F 3/24* (2013.01); *H04B 1/0475* (2013.01); *H04B 1/525* (2013.01); *H04L 27/364* (2013.01); *H03F 2200/336* (2013.01); *H03F 2200/451* (2013.01); *H04B 2001/0425* (2013.01)

(58) Field of Classification Search
USPC ................ 375/221; 455/67.14, 631, 67.13
See application file for complete search history.

(56) References Cited

U.S. PATENT DOCUMENTS

| | | | |
|---|---|---|---|
| 4,031,469 A | * | 6/1977 | Johnson ............... 455/226.4 |
| 5,381,108 A | * | 1/1995 | Whitmarsh et al. ........... 330/2 |
| 6,366,177 B1 | | 4/2002 | McCune et al. |
| 6,724,331 B1 | | 4/2004 | El-Ghoroury et al. |
| 7,187,916 B2 | | 3/2007 | Mo et al. |
| 7,415,261 B2 | | 8/2008 | Rosik et al. |
| 7,463,864 B2 | | 12/2008 | Vassiliou et al. |
| 7,532,679 B2 | | 5/2009 | Staszewski et al. |
| 7,565,119 B2 | | 7/2009 | Cohen |
| 7,596,363 B2 | | 9/2009 | Mo et al. |
| 7,616,929 B2 | | 11/2009 | Behzad |

(Continued)

FOREIGN PATENT DOCUMENTS

| | | |
|---|---|---|
| CN | 102474221 A | 5/2012 |
| TW | 200525878 A | 8/2005 |

(Continued)

OTHER PUBLICATIONS

European Search Report in co-pending, related EP Application No. 13003506.6 mailed Oct. 31, 2013.

*Primary Examiner* — Nay A Maung
*Assistant Examiner* — Erica Fleming-Hall
(74) *Attorney, Agent, or Firm* — McDermott Will & Emery LLP

(57) ABSTRACT

In one embodiment, a method comprising during a first calibration instance, converting at a first transconductance stage a first output voltage from a power amplifier of a transceiver to a first set of current signals; and during a second calibration instance not overlapping the first calibration instance, converting at a second transconductance stage a second output voltage from the power amplifier to a second set of current signals.

20 Claims, 3 Drawing Sheets

(56) References Cited

U.S. PATENT DOCUMENTS

| | | |
|---|---|---|
| 7,620,373 B2 | 11/2009 | Cole et al. |
| 7,627,060 B2 * | 12/2009 | Taylor .......................... 375/324 |
| 7,715,836 B2 | 5/2010 | Vassiliou et al. |
| 7,817,747 B2 | 10/2010 | Waheed et al. |
| 7,817,970 B2 | 10/2010 | Puma |
| 7,818,028 B2 | 10/2010 | Vassiliou et al. |
| 7,840,198 B2 | 11/2010 | Behzad et al. |
| 7,873,325 B2 | 1/2011 | Behzad |
| 7,881,463 B1 | 2/2011 | Sodersjerna et al. |
| 7,907,916 B2 | 3/2011 | Cole et al. |
| 7,965,988 B2 | 6/2011 | Cole et al. |
| 7,974,593 B2 | 7/2011 | Cole et al. |
| 8,010,076 B2 | 8/2011 | Mo et al. |
| 8,041,306 B2 | 10/2011 | Behzad |
| 8,055,217 B2 | 11/2011 | Ba et al. |
| 8,073,074 B2 | 12/2011 | Waheed et al. |
| 8,180,304 B2 | 5/2012 | Ma et al. |
| 8,195,103 B2 | 6/2012 | Waheed et al. |
| 8,224,250 B2 * | 7/2012 | Behzad et al. .............. 455/63.1 |
| 8,355,462 B2 * | 1/2013 | Beidas et al. ................ 375/296 |
| 8,699,620 B1 * | 4/2014 | Wu .............................. 375/297 |
| 2002/0027474 A1 * | 3/2002 | Bonds ........................... 330/149 |
| 2002/0113645 A1 * | 8/2002 | Lauffenburger ........ H03F 1/303 330/9 |
| 2003/0032394 A1 * | 2/2003 | Westra ..................... H04B 1/583 455/78 |
| 2003/0107434 A1 * | 6/2003 | Mitzlaff ....................... 330/149 |
| 2004/0106380 A1 * | 6/2004 | Vassiliou et al. ............... 455/73 |
| 2005/0156662 A1 * | 7/2005 | Raghupathy et al. .......... 330/10 |
| 2005/0157819 A1 | 7/2005 | Wang |
| 2005/0181754 A1 * | 8/2005 | Wu ...................... H03H 11/1291 455/251.1 |
| 2007/0042743 A1 * | 2/2007 | Ali et al. ....................... 455/313 |
| 2007/0190952 A1 * | 8/2007 | Waheed ............... H04B 1/0475 455/114.3 |
| 2007/0281652 A1 * | 12/2007 | Tanaka ................. H03G 1/0088 455/260 |
| 2008/0139119 A1 * | 6/2008 | Behzad et al. ............... 455/41.2 |
| 2008/0144539 A1 * | 6/2008 | Sperlich et al. .............. 370/278 |
| 2009/0088086 A1 * | 4/2009 | Vassiliou et al. ............... 455/84 |
| 2009/0184763 A1 * | 7/2009 | Kim ........................... 330/124 R |
| 2009/0270054 A1 * | 10/2009 | Ridgers et al. ............... 455/110 |
| 2009/0289707 A1 * | 11/2009 | Watanabe ...................... 330/149 |
| 2010/0090765 A1 * | 4/2010 | Hurwitz ................ H03G 3/001 330/254 |
| 2010/0112967 A1 * | 5/2010 | Sorensen ................... 455/127.2 |
| 2010/0167677 A1 * | 7/2010 | Klesenski .................. 455/232.1 |
| 2011/0051868 A1 * | 3/2011 | Roufoogaran et al. ....... 375/350 |
| 2011/0069767 A1 * | 3/2011 | Zhu .............................. 375/259 |
| 2011/0092180 A1 * | 4/2011 | Chen et al. .................. 455/341 |
| 2011/0217945 A1 * | 9/2011 | Uehara et al. ................ 455/341 |
| 2012/0170622 A1 | 7/2012 | Ly-Gagnon |
| 2012/0263215 A1 * | 10/2012 | Peng ........................... 375/221 |
| 2013/0058388 A1 * | 3/2013 | Muhammad ................ 375/222 |
| 2013/0195152 A1 * | 8/2013 | Muhammad ................ 375/219 |
| 2013/0208827 A1 * | 8/2013 | Muhammad et al. ........ 375/297 |
| 2013/0279630 A1 * | 10/2013 | Xu et al. ...................... 375/297 |
| 2013/0344827 A1 * | 12/2013 | Epifano ..................... 455/114.3 |
| 2014/0057684 A1 * | 2/2014 | Khlat ........................... 455/574 |

FOREIGN PATENT DOCUMENTS

| | | |
|---|---|---|
| TW | 200843369 A | 11/2008 |
| TW | 200904017 A | 1/2009 |
| TW | 200941928 A | 10/2009 |
| WO | 01/63791 A2 | 8/2001 |

* cited by examiner

CALIBRATION FOR POWER AMPLIFIER PREDISTORTION

TECHNICAL FIELD

The present disclosure is generally related to communications devices, and more particularly, to predistortion techniques.

BACKGROUND

Communications devices continue to expand in the functionality and services available to a user, providing on demand video, audio, and/or Internet services, in addition to wireless radio frequency (RF) transmission and reception. This ever expanding functionality presents challenges to the design of communications devices, particularly in efforts that seek to improve energy efficiency and data communication integrity while reducing semiconductor real estate. For instance, many wireless standards specify a total power dissipation that is not to be exceeded by a power amplifier located within a wireless transmitter. One technique to reduce power dissipation that has been the focus of much literature is the use of a nonlinear power amplifier in combination with the implementation of linearization techniques, such as predistortion. Predistortion uses information about the nonlinearity of the power amplifier to predistort signals before they are amplified to counter the nonlinearity of the power amplifier when signals are amplified. Such techniques use calibrations to characterize the nonlinear operation of the power amplifier.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
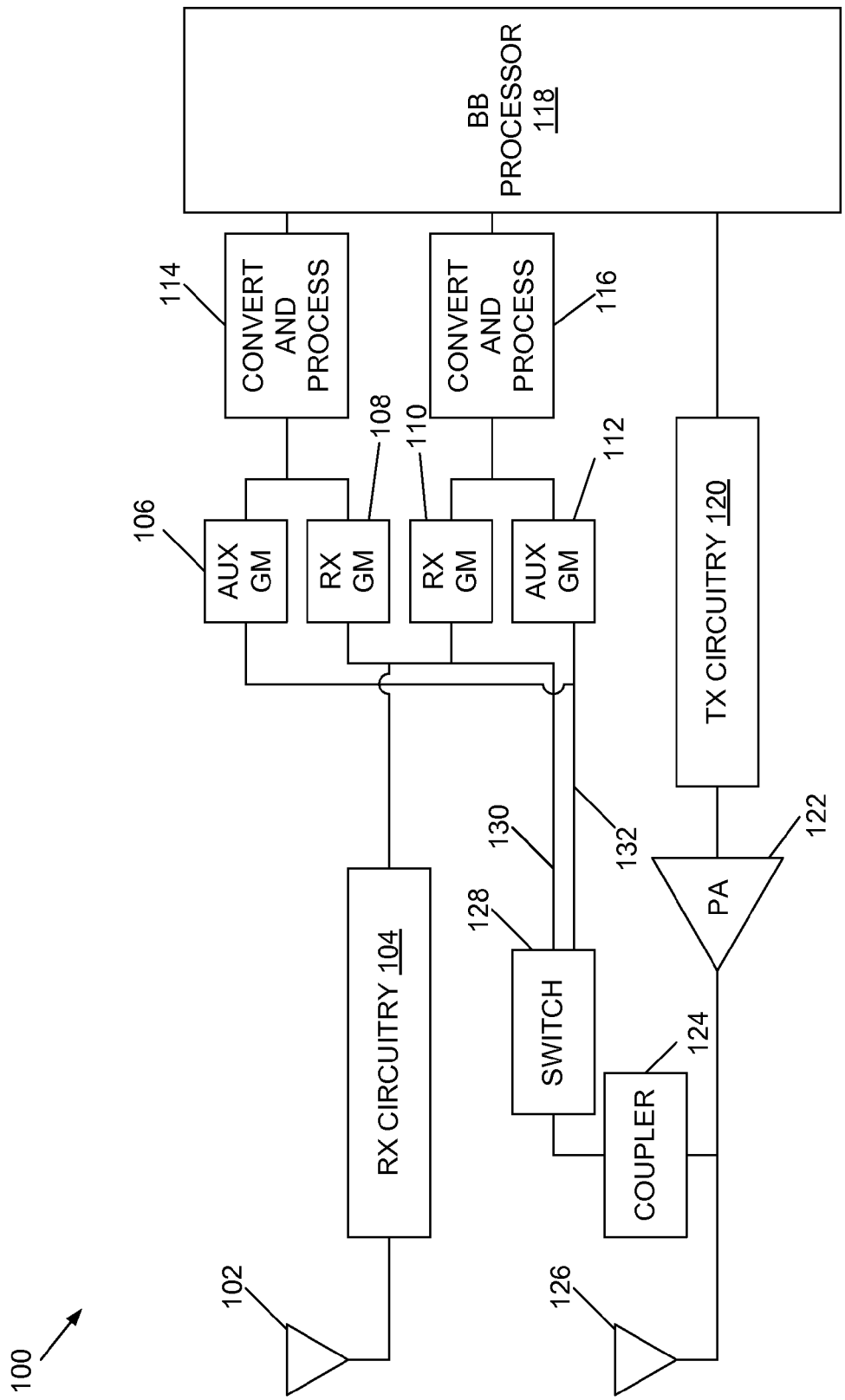
FIG. 1 is a block diagram of an example environment in which an embodiment of a predistortion calibration system may be employed.

Disclosed herein are certain embodiments of predistortion calibration systems and methods that involve wireless transceiver calibration through a receiver path with separate transconductors and shared downconversion mixers. More particularly, in one embodiment, a separate power amplifier predistortion calibration path is added to a receiver in-phase/quadrature (IQ) calibration path. The predistortion calibration path comprises its own transconductance stage. The predistortion calibration path is completely isolated from a main receiver path and its associated inductance circuitry. The two calibration paths share the same receive mixers, which simplifies the local oscillator (LO) path and saves on die area.

In contrast, existing systems may rely on looping back the transmission signal to the receiver path, usually at the mixer input. Most wireless receiver front ends comprise low noise circuitry (e.g., low noise amplifiers, inductors/baluns) that drive a mixer. The mixer is further divided into a transconductance stage and a frequency translating switching quad. Some shortcomings of these conventional designs may include secondary loopbacks and parasitic coupling. For instance, during a loopback operation, the low noise amplifiers are turned off to prevent a secondary loopback from being present. However, even with the low noise amplifiers turned off, a finite coupling occurs through the low noise amplifiers (e.g., parasitic magnetic, substrate, and/or package coupling).

Certain embodiments address one or more of these challenges by rejecting the parasitic coupling path through the use of a secondary (auxiliary) transconductance stage associated with the mixer, the secondary transconductance stage used exclusively for this loopback. In loopback operation, the primary mixer transconductance stage is powered off. Hence, improvements may be realized in fidelity of the loopback path due to reductions in stray coupling paths, enabling a more accurate replication of transmitter path non-ideal effects and enabling improved cancellation of such non-ideal effects through the process of predistortion.

Having summarized features/benefits of certain embodiments of predistortion calibration systems, reference will now be made in detail to the description of the disclosure as illustrated in the drawings. While the disclosure will be described in connection with these drawings, there is no intent to limit it to the embodiment or embodiments disclosed herein. For instance, though described in the context of a wireless communications device (e.g., wireless transceiver), certain embodiments of predistortion calibration systems may be employed in any device where parasitic coupling paths are of concern. Further, although the description identifies or describes specifics of one or more embodiments, such specifics are not necessarily part of every embodiment, nor are all various stated advantages necessarily associated with a single embodiment or all embodiments. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set out in the description.

Referring to FIG. 1, shown is a block diagram of an example environment in which an embodiment of a predistortion calibration system may be employed. One having ordinary skill in the art should appreciate in the context of the present disclosure that other systems where predistortion may be utilized are contemplated, and hence FIG. 1 is merely for illustrative purposes, with other variations contemplated to be within the scope of the disclosure. The environment depicted in FIG. 1 comprises a communications device embodied as a wireless transceiver 100. The wireless transceiver 100 may be employed in a variety of communications devices with wireless functionality or wireless and wired functionality, such as a computer, laptop, smartphone, cellular phone, personal digital assistant, television, server device, router, among other electronic appliances. The wireless transceiver 100 depicted in FIG. 1 comprises a receive antenna 102 coupled to receiver (Rx) circuitry 104. The receiver circuitry 104 comprises well-known front end circuitry, such as low noise amplifiers, inductors/baluns, among other circuits, used to condition a received signal. The receiver circuitry 104 is coupled to a first transconductance stage comprising plural transconductance circuits (e.g., transconductance amplifiers, which convert voltage to current). For instance the first transconductance stage comprises receiver transconductance (Rx Gm) circuits 108 and 110. Also included is a second transconductance stage comprising plural transconductance circuits (e.g., transconductance amplifiers). For instance the second transconductance stage comprises auxiliary transconductance (Aux GM) circuits 106 and 112. The second transconductance stage is not coupled to the receiver circuitry 104 (i.e., it is isolated from or decoupled from the receiver circuitry 104). In one embodiment, the auxiliary transconductance circuits 106 and 112 are smaller than the receiver transconductance circuits 108 and 110, such as to avoid parasitic capacitance that may hinder signal flow in the transceiver 100, among other benefits.

At the output of the transconductance circuits 106 and 108 is convert and process circuitry 114, which includes a mixer (e.g., an in-phase or I signal mixer) among other well-known signal processing circuitry to filter and convert a signal to enable digital signal processing. At the output of the transconductance circuits 110 and 112 is convert and process circuitry 116, which also includes a mixer (e.g., a quadrature or Q signal mixer) among other well-known signal processing circuitry similar to that found in circuitry 114. It should be appreciated that the general depiction of components shown in FIG. 1 is merely illustrative, and that the arrangements of components in practice may be according to different configurations and/or combinations in some embodiments. The convert and process circuitry 114, 116 are coupled to a baseband (BB) processor 118 (e.g., microprocessor, CPU, digital signal processor (DSP), etc.), which evaluates information (e.g., voltage levels, distortion, noise level, etc.) associated with the input to the baseband processor 118 and makes a determination as to suitable predistortion adjustments. The baseband processor 118 may also include functionality for further and/or additional processing, such as to drive output devices, translate inputs (e.g., microphone or other user inputs), among other well-known functions.

The baseband processor 118 is coupled to transmitter (Tx) circuitry 120, which comprises well-known circuitry to convert the digital signal of the baseband processor 118 to an analog circuit, as well as perform filtering and mixing (e.g., upconversion) functions as would be appreciated by one having ordinary skill in the art. The transmitter circuitry 120 is coupled at its output to a power amplifier (PA) 122. The power amplifier 122 amplifies the processed analog signal for transmission via transmit antenna 126. The power amplifier 122 is a non-linear component for which predistortion is applied to linearize non-ideal effects of the power amplifier. To facilitate the predistortion process, the output of the power amplifier 122 is also looped back to the first and second transconductance stages. As depicted in FIG. 1, the output of the power amplifier 122 is provided to a loopback coupler 124, which attenuates the signal in a linear manner. The output of the loopback coupler 124 is provided to a switch 128. In one embodiment, the switch 128 may be embodied as a demultiplexer, where the output of the switch 128 is selectively provided over plural calibration paths. For instance, one path is referred to herein as a receiver IQ calibration path 130, which in one embodiment includes the first transconductance stage comprising the receiver transconductance circuitry 108 and 110.

The receiver IQ calibration path 130 is coupled to the receiver circuitry 104. As should be appreciated by one having ordinary skill in the art, the receiver IQ calibration path 130 is used to calibrate IQ un-balance between the receiver transconductance circuitry 108 plus convert and process circuitry 114 and the receiver transconductance circuitry 110 plus convert and process circuitry 116, using the power amplifier output as a test signal. The IQ un-balance refers to the undesired deviation from the perfectly quadrature (i.e., ninety (90) degrees) relationship between the receiver transconductance circuitry 108 plus convert and process circuitry 114 and the receiver transconductance circuitry 110 plus convert and process circuitry 116. Known circuitry is used to calibrate the IQ un-balance of the transmitter circuitry 120 and the power amplifier 122. The IQ un-balance may arise primarily from the transmitter circuitry 120. For instance, an envelope detector may sense the output of the transmitter circuitry 120 (or power amplifier output in some embodiments), and the baseband processor 118 may cooperate with additional circuitry (e.g., a baseband amplifier and analog to digital converter in the convert and process circuitry 114) to determine the amount of IQ un-balance in the transmitter circuitry 120. The baseband processor 118 may then cancel the un-balance by adjusting the signal phases at an I input of the transmitter circuitry 120 (e.g., at a digital to analog converter) and a Q input of the transmitter circuitry 120 (e.g., at a digital to analog converter). Another path, referred to herein as the power amplifier predistortion calibration path and denoted as 132, includes the second transconductance stage comprising the auxiliary transconductance circuitry 106 and 112 and is decoupled from the receiver circuitry 104. The receiver IQ calibration path 130 is not needed for PA predistortion calibration.

In one embodiment, the switch 128 activates either the receiver IQ calibration path 130 or the power amplifier predistortion calibration path 132. In other words, either the first transconductance stage is activated (e.g., during a first instance or time period) or the second transconductance stage is activated (e.g., during another instance or time period that does not overlap the first instance), but not both at the same time. In one embodiment, the receiver IQ calibration path 130 and the power amplifier predistortion calibration path 132 are disabled during actual reception/transmission of a signal (e.g., applied only during idle time and before transmission or receipt of a data packet). In some embodiments, the switch 128 may be omitted, wherein the isolation of the first transconductance stage, when it is turned off, is sufficient to mitigate parasitic (e.g., magnetic) coupling (e.g., compared to the use of only the first transconductance stage) borne from inductive sources (e.g., inductors/baluns, LNAs, etc.) of the receiver circuitry 104.

In operation, signal information received at the baseband processor 118 from the calibration paths and convert and process circuitry 114, 116 is evaluated by the baseband processor 118 to determine, among other things, how much distortion is associated with the power amplifier 122, and hence how much predistortion to apply to the power amplifier 122 to linearize the non-ideal effects. The first and second transconductance stages serve to suppress the noise of subsequent stages, providing a low noise figure to facilitate the linearization operation of the baseband processor 118. The addition of the second transconductance stage provides linearization and noise suppression as part of the predistortion process without the deleterious effects of parasitic coupling from the receiver circuitry 104.

Figure 2:
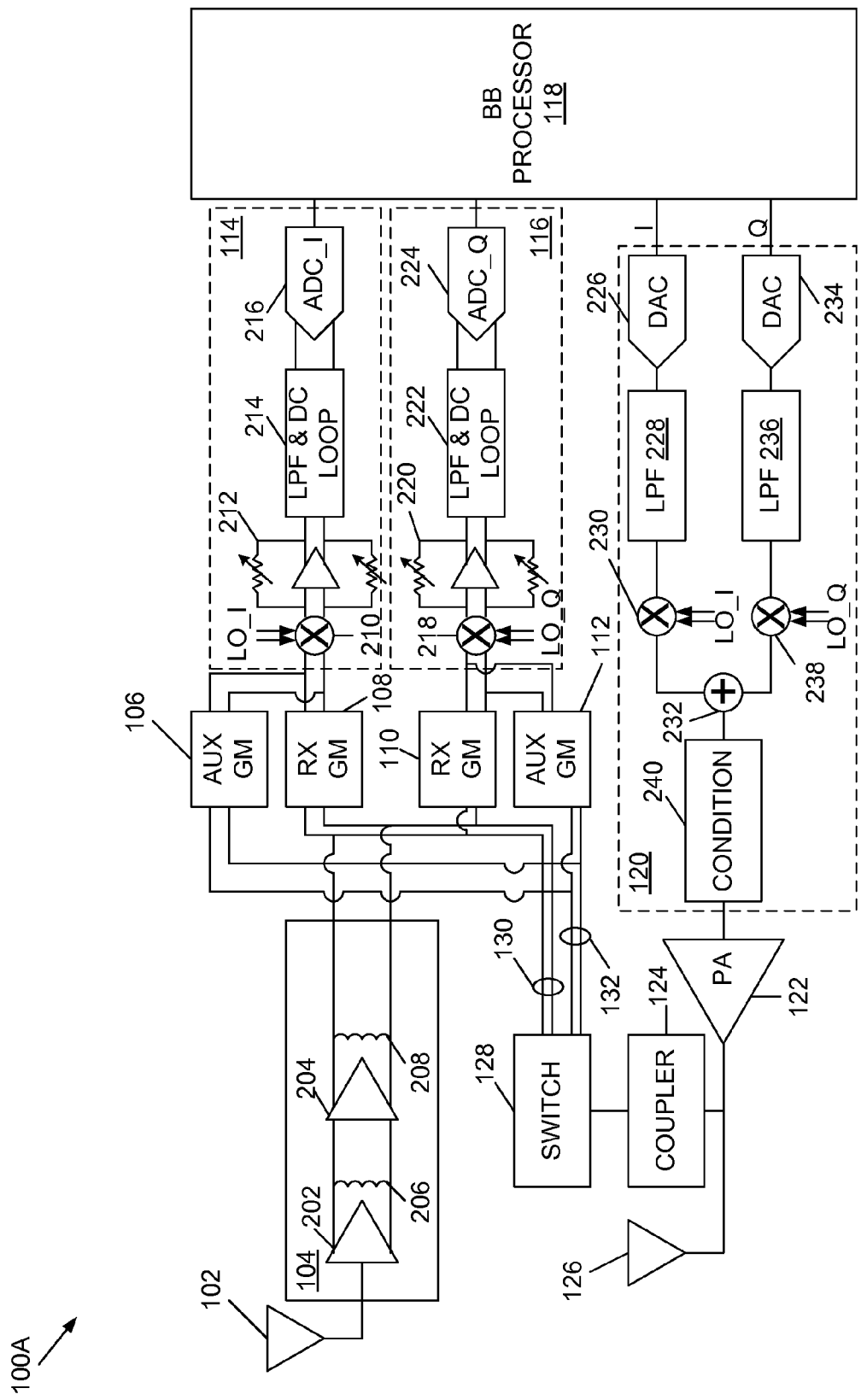
FIG. 2 is a block diagram that illustrates an embodiment of a predistortion calibration system employed in a communications device.

Having described an example environment 100 in which an embodiment of a predistortion calibration system may be employed, attention is directed to FIG. 2, which provides further detail of the example wireless transceiver 100 depicted in FIG. 1, denoted in FIG. 2 as wireless transceiver 100A. It should be appreciated that the example wireless transceiver 100A shown in FIG. 2 is merely illustrative of an embodiment of a predistortion calibration system, and that some embodiments of predistortion calibration systems may be implemented in different configurations of communications devices. One embodiment of a predistortion calibration system may include the entirety of the wireless transceiver 100A, or a subset thereof in some embodiments. Description for elements with the same reference numbers as those described in association with FIG. 1 is omitted below, except where used to further describe certain features. As shown, a signal is received at the receiver antenna 102, and provided to the receiver circuitry 104. The receiver circuitry 104 comprises circuitry having one or more low noise amplifiers (two shown in this example) 202 and 204, and one or more baluns or inductors 206, 208. The receiver circuitry 104 may comprise other circuitry, as would be appreciated by one having ordinary skill in the art. The output of the receiver circuitry 104 is coupled to the first transconductance stage of the receiver IQ calibration path 130, and in particular, to receiver transconductance circuits 108 and 110. Also shown is the power amplifier predistortion calibration path 132, which includes the auxiliary transconductance circuits 106 and 112, and which is decoupled from the output receiver circuitry 104. In one embodiment, the auxiliary transconductance circuits 106 and 112 are switchably isolated (e.g., via switch 128) from the receiver transconductance circuits 108 and 110.

In one embodiment, at any given instance of time, either the output of the auxiliary transconductance circuit 106 or receiver transconductance circuit 108 (e.g., but not both in this embodiment) is provided to the I signal path of the convert and process circuitry 114. The I signal path comprises a downconversion mixer 210 that receives an oscillation signal, LO_I, and uses the oscillation signal to downconvert the signal received from the auxiliary transconductance circuit 106 or receiver transconductance circuit 108. The I signal path further comprises a transimpedance amplifier (TIA) 212, which converts the downconverted current signals to voltage signals. The voltage signals are low pass filtered and DC corrected by another I signal path component, low pass filter (LPF) and DC correction loop circuitry 214, and then provided to an analog to digital converter (ADC_I) 216 for digitizing signals of the I signal path. The output of the ADC_I 216 is provided to the baseband processor 118. The Q signal path of the convert and process circuitry 116 is functionally and architecturally similar to the I signal path of the convert and process circuitry 114, and comprises a downconversion mixer 218 (which receives oscillation signal, LO_Q) coupled to a transimpedance amplifier (TIA) 220, which is coupled to a low pass filter (LPF) and DC correction loop circuitry 222. The Q signal path further comprises an analog to digital converter (ADC_Q) 224 coupled to the output of the low pass filter and DC correction loop circuitry 222, the analog to digital converter 224 digitizing the filtered signal received from the low pass filter and DC correction loop circuitry 222 and providing an output to the baseband processor 118.

The baseband processor 118 processes input signals (e.g., voice, data, etc.) and provides the processed signals adjusted for predistortion to the transmitter circuitry 120 for eventual transmission. In one embodiment, the transmitter circuitry 120 comprises I and Q signal paths. In the I signal path, the transmitter circuitry 120 comprises a digital to analog converter (DAC) 226, low pass filter (LPF) 228, upconversion mixer 230 that outputs to a summer 232. The Q signal path likewise comprises a digital to analog converter (DAC) 234, low pass filter (LFP) 236, and upconversion mixer 238 that outputs to the summer 232. The digital to analog converters 226 and 234 convert the baseband signals to analog, and the low pass filters 228 and 236 filter the converted analog signals. The outputs of the low pass filters 228 and 236 are provided to upconversion mixers 230, 238, which respectively receive oscillation signals (LO_I and LO_Q) to upconvert the filtered analog signals. It is noted that the aforementioned IQ un-balance described in association with FIG. 1 occurs mainly from between upconversion mixer 230 plus LPF 228 and upconversion mixer 238 plus LPF 236. The summer 232 sums the mixed signals and provides the output to condition circuitry 240, which provides preliminary signal conditioning prior to passing the signals to the power amplifier 122. The condition circuitry 240 may comprise one or more inductors/baluns, which may function as a radio frequency (RF) load of the summer 232 and upconversion mixers 230, 238. In addition, the condition circuitry 240 may include one or more gain stages, each of which may include a load inductor/balun. Certain embodiments of predistortion calibration systems serve to counter the undesired magnetic coupling from the inductive circuitry of the condition circuitry of 120 to the inductive circuitry of the receiver circuitry 104.

In one embodiment of example operations, as described in association with FIG. 1, the switch 128 operably activates either the receiver IQ calibration path 130 or the power amplifier predistortion calibration path 132. In some embodiments, both paths may be alternately activated by another component (e.g., a processor, such as baseband processor 118). When the power amplifier predistortion calibration path 132 is activated, the second transconductance stage, which is decoupled from the receiver circuitry 104, facilitates predistortion processing by providing a linear signal through the second transconductance stage that is unaffected (or insignificantly affected) by undesired magnetic coupling injected into the baluns 206, 208 and/or inductance associated with the low noise amplifiers 202 and 204.

Note that the transceivers 100 and 100A depicted in FIGS. 1 and 2 are merely illustrative, and that some embodiments of predistortion calibration systems may be embodied in different architectures or systems in general.

Figure 3:
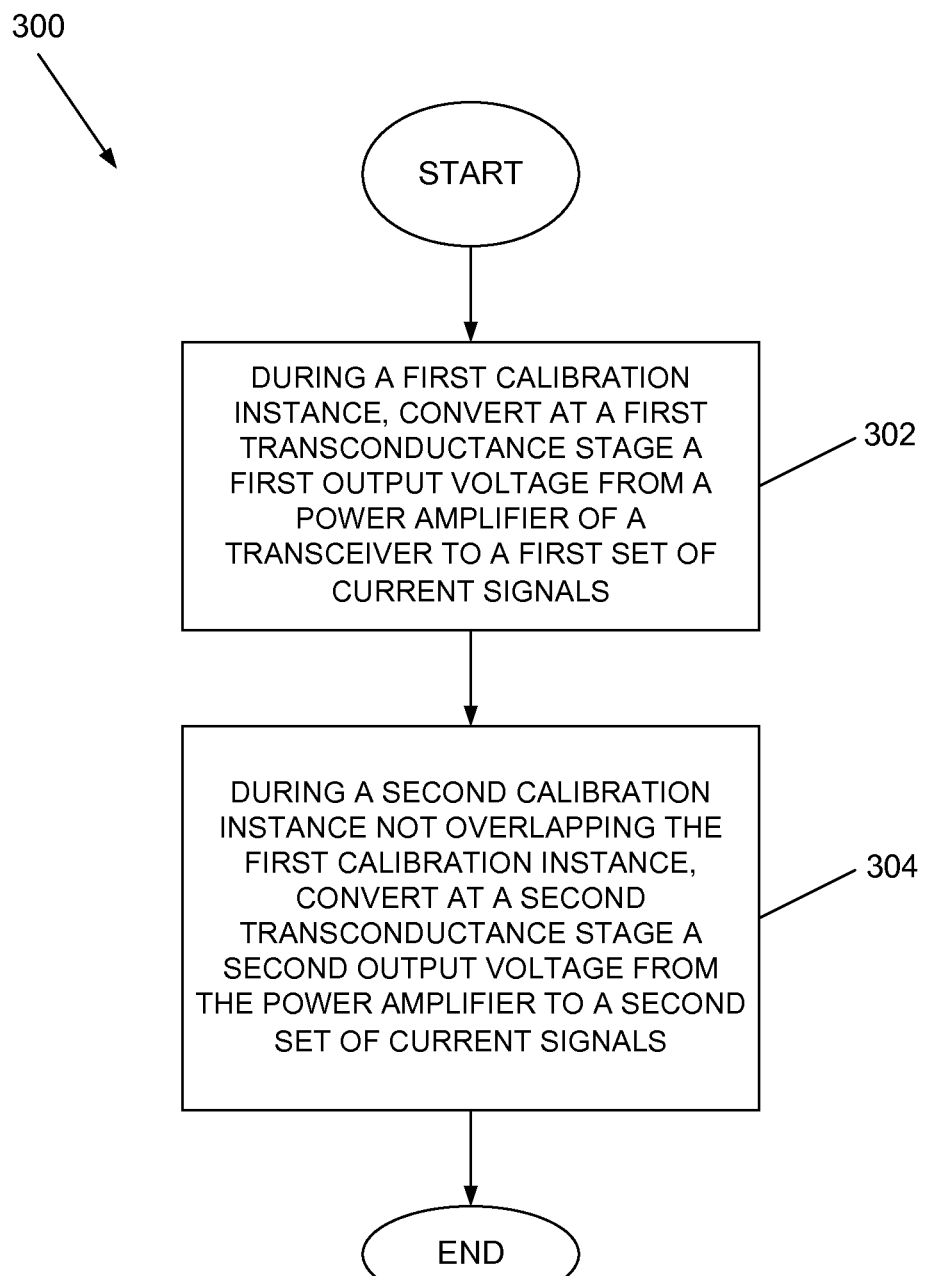
FIG. 3 is a flow diagram that illustrates one embodiment of an example predistortion calibration method.

It should be appreciated in the context of the above description that one method embodiment, denoted method 300 and shown in FIG. 3, comprises during a first calibration instance, converting at a first transconductance stage a first output voltage from a power amplifier of a transceiver to a first set of current signals (302); and during a second calibration instance not overlapping the first calibration instance, converting at a second transconductance stage a second output voltage from the power amplifier to a second set of current signals (304). In some embodiments, the method 300 further comprises applying predistortion to the power amplifier based on information received from the first and second calibration instances. In some embodiments, the first transconductance stage is coupled to circuitry comprising a transceiver low noise amplifier circuit, a balun, or a combination of both, and the second transconductance stage is decoupled from the circuitry. In some embodiments, the method 300 further comprises mixing the first and second set of current signals at plural downconversion mixers shared between the first and second transconductance stages, converting the first and second set of mixed current signals to a corresponding first and second set of voltage signals, and processing the first and second set of voltage signals to evaluate distortion associated with the power amplifier. In some embodiments, the first transconductance stage comprises first and second transconductance amplifiers and the second transconductance stage comprises third and fourth transconductance amplifiers isolated from the first and second transconductance amplifiers.

The predistortion calibration system may be implemented in hardware, software (e.g., including firmware), or a combination thereof. In one embodiment(s), the predistortion calibration system is implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In embodiments, where all or a portion of the predistortion calibration systems is implemented in software, the software is stored in a memory and that is executed by a suitable instruction execution system (e.g., a computer system, including one or more processors, memory encoded with encoding software/firmware and an operating system, etc.).

Any process descriptions or blocks in flow diagrams should be understood as representing modules, segments, or portions of code which include one or more executable instructions for implementing specific logical functions or steps in the process, and alternate implementations are included within the scope of the disclosure in which functions may be executed out of order from that shown or discussed, including substantially concurrently or in reverse order, depending on the functionality involved, as would be understood by those reasonably skilled in the art.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. A transceiver, comprising:
   a power amplifier;
   a loopback coupler coupled to an output of the power amplifier and configured to attenuate the output;
   a switch coupled to the loopback coupler;
   plural downconversion mixers;
   a first transconductance stage coupled to the switch and receiver front end circuitry including a low-noise amplifier (LNA); and
   a second transconductance stage isolated from the receiver front end circuitry including the LNA, wherein the first transconductance stage or the second transconductance stage are selectively coupled via the switch to the output of the power amplifier, and wherein the second transconductance stage includes two transconductance circuits sharing a common input connected via the switch to the loopback coupler and including a first transconductance circuit coupled to a first downconversion mixer of the plural downconversion mixers and a second transconductance circuit coupled to a second downconversion mixer of the plural downconversion mixers.

2. The transceiver of claim 1, wherein the first transconductance stage corresponds to a first calibration path of the transceiver and the second transconductance stage corresponds to a second calibration path of the transceiver.

3. The transceiver of claim 1, wherein the first transconductance stage comprises a first transconductance circuit and a second transconductance circuit in parallel arrangement to the first transconductance circuit.

4. The transceiver of claim 3, wherein the second transconductance stage comprises a third transconductance circuit and a fourth transconductance circuit in parallel arrangement to the third transconductance circuit.

5. The transceiver of claim 4, wherein the first and third transconductance circuits are switchably coupled to one of the plural downconversion mixers.

6. The transceiver of claim 5, wherein the second and fourth transconductance circuits are switchably coupled to another of the plural downconversion mixers.

7. The transceiver of claim 4, wherein the first and third transconductance circuits differ in size, and wherein the second and fourth transconductance circuits differ in size.

8. The transceiver of claim 1, wherein the switch is configured to turn the first and second transconductance stages on and off, wherein of the first and second transconductance stages, either only the first transconductance stage or only the second transconductance stage is turned on at any one time.

9. The transceiver of claim 1, wherein the receiver front end circuitry comprises one or more baluns or inductors or a combination of one or more LNAs and the one or more baluns or inductors.

10. The transceiver of claim 1, further comprising:
    plural convert and process circuitry coupled to a respective output of each of the plural downconversion mixers; and
    a baseband processor coupled to the plural convert and process circuitry, the baseband processor configured to apply predistortion to the power amplifier based on information received from alternate activation of the first and second transconductance stages.

11. A method, comprising:
    during a first calibration instance including a receiver calibration, converting at a first transconductance stage a first output voltage from a power amplifier of a transceiver to a first set of current signals; and
    during a second calibration instance not overlapping the first calibration instance and including a transmitter calibration, converting at a second transconductance stage a second output voltage from the power amplifier to a second set of current signals, wherein the second transconductance stage is isolated from receiver front end circuitry including a low-noise amplifier (LNA), and wherein the second transconductance stage includes two transconductance circuits sharing a common input connected via the switch to the loopback coupler and including a first transconductance circuit coupled to a first downconversion mixer of the plural downconversion mixers and a second transconductance circuit coupled to a second downconversion mixer of the plural downconversion mixers.

12. The method of claim 11, further comprising applying predistortion to the power amplifier based on information received from the first and second calibration instances.

13. The method of claim 11, wherein the first transconductance stage is coupled to the receiver front end circuitry comprising a balun or an inductor or a combination of both.

14. The method of claim 11, further comprising mixing the first and second set of current signals at plural downconversion mixers shared between the first and second transconductance stages.

15. The method of claim 14, further comprising converting the first and second set of current signals to a corresponding first and second set of voltage signals.

16. The method of claim 15, further comprising processing the first and second set of voltage signals to evaluate distortion associated with the power amplifier.

17. The method of claim 11, wherein the first transconductance stage comprises first and second transconductance amplifiers and the second transconductance stage comprises third and fourth transconductance amplifiers isolated from the first and second transconductance amplifiers.

18. A system, comprising:
a first transconductance stage operably coupled to a power amplifier and front end circuitry including a low-noise amplifier (LNA) of a transceiver to facilitate a transceiver calibration; and
a second transconductance stage operably coupled to the power amplifier to facilitate a transmitter calibration, wherein the second transconductance stage is isolated from the front end circuitry including the LNA, and the first and the second transconductance stages are coupled to the power amplifier via a demultiplexers, and wherein the second transconductance stage includes two transconductance circuits sharing a common input connected via the switch to the loopback coupler and including a first transconductance circuit coupled to a first downconversion mixer of the plural downconversion mixers and a second transconductance circuit coupled to a second downconversion mixer of the plural downconversion mixers.

19. The system of claim 18, wherein the first and second transconductance stages share plural downconversion mixers.

20. The system of claim 18, further comprising a switch coupled to the first and second transconductance stages, wherein the switch alternately activates the first and second transconductance stages.

* * * * *